US010896133B2

(12) United States Patent
Shaw

(10) Patent No.: US 10,896,133 B2
(45) Date of Patent: Jan. 19, 2021

(54) COMBINATIONAL ADDRESS REPAIR IN MEMORY CONTROLLER

(71) Applicant: Microsoft Technology Licensing, LLC, Redmond, WA (US)

(72) Inventor: Mark E. Shaw, Redmond, WA (US)

(73) Assignee: MICROSOFT TECHNOLOGY LICENSING, LLC, Redmond, WA (US)

(*) Notice: Subject to any disclaimer, the term of this patent is extended or adjusted under 35 U.S.C. 154(b) by 34 days.

(21) Appl. No.: 16/022,598

(22) Filed: Jun. 28, 2018

(65) Prior Publication Data

US 2019/0370183 A1 Dec. 5, 2019

Related U.S. Application Data

(63) Continuation of application No. 62/678,905, filed on May 31, 2018.

(51) Int. Cl.
G06F 12/10 (2016.01)
G06F 12/02 (2006.01)
G06F 12/0804 (2016.01)

(52) U.S. Cl.
CPC .......... G06F 12/10 (2013.01); G06F 12/0246 (2013.01); G06F 12/0804 (2013.01);
(Continued)

(58) Field of Classification Search
CPC ..... G06F 2212/70–7211; G06F 12/0246–0276
See application file for complete search history.

(56) References Cited

U.S. PATENT DOCUMENTS 6,411,558 B1   6/2002  Tanaka
8,473,791 B2   6/2013  Shaw et al.
(Continued)

FOREIGN PATENT DOCUMENTS

GB   2136992 A   9/1984

OTHER PUBLICATIONS

"International Search Report and Written Opinion Issued in PCT Application No. PCT/US2019/032549", dated Aug. 2, 2019, 14 Pages.

Primary Examiner — Nicholas J Simonetti
(74) Attorney, Agent, or Firm — Workman Nydegger

(57) ABSTRACT

A memory controller that performs address replacement using combinational logic. A dedicated buffer receives a target address corresponding to a memory operation instruction. Another dedicated buffer holds a problem address. Yet another dedicated buffer holds a repair address to be used to replace the problem address when memory operations instructions are targeted at that problem address. An address compare combinational circuit compares a received target address held by the dedicated target address buffer with a problem address held by the dedicated repair address buffer. If there is a match, the address compare combinational circuit generates a match notification signal. In response to a match notification signal, an address circuit, which may also be a combinational circuit, responds by causing the repair address within the dedicated repair address buffer to be targeted by the memory operation instruction instead of the problem address being targeted.

20 Claims, 4 Drawing Sheets

(52) U.S. Cl.
CPC ............... *G06F 2212/1032* (2013.01); *G06F 2212/608* (2013.01); *G06F 2212/7201* (2013.01)

(56) References Cited

U.S. PATENT DOCUMENTS

| | | | |
|---|---|---|---|
| 2002/0078294 A1* | 6/2002 | Tsuchida | G11C 7/1072 711/105 |
| 2006/0126408 A1 | 6/2006 | Bucksch | |
| 2007/0205974 A1* | 9/2007 | Iizuka | G09G 3/3648 345/98 |
| 2010/0235605 A1* | 9/2010 | Perry | G06F 12/0246 711/170 |
| 2011/0267899 A1 | 11/2011 | Kim et al. | |
| 2019/0102319 A1* | 4/2019 | Nakanishi | G06F 12/0246 |

* cited by examiner

COMBINATIONAL ADDRESS REPAIR IN MEMORY CONTROLLER

CROSS-REFERENCE TO RELATED APPLICATIONS

This application claims the benefit of and priority to U.S. Provisional Patent Application Ser. No. 62/678,905 filed on May 31, 2018 and entitled "COMBINATIONAL ADDRESS REPAIR IN MEMORY CONTROLLER," which application is expressly incorporated herein by reference in its entirety.

BACKGROUND

Computing systems allow for a wide variety of functions to be performed. Nearly all of such functions include the processing of information (also called data). In all but the most simple of data processing, data is often held at least temporarily within system memory. System memory is memory that has multiple address locations which may be addressed by a processor. When the processor is to command a memory operation to be performed, the processor communicates both a target address and a command (e.g., read, write, delete) to a memory controller. The memory controller ensures that the commanded operation is performed on the target address of the system memory. Some common types of memory include random-access memory (or RAM) such as dynamic RAM (or DRAM). Other types of memory include flash memory. System memory has traditionally been volatile, meaning that the contents of the memory are lost if power is interrupted. However, system memory may also be non-volatile, or a combination of volatile, and non-volatile.

Occasionally, a location within the system memory may fail. The granularity of such failures may be as small as a single bit, but may be as large as the entirety of the system memory. Bit failures are, however, the most common form of errors. Bit failures can often be corrected by reading from, and re-writing to, a portion of memory that includes the failed bit. Associated redundancy data may be used to determine what the data was at that bit, so that upon re-writing, the lost data is restored to that bit location. Sometimes, however, the bit location is not operating properly, such that even a re-write will not correct the bit failure.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

At least some embodiments described herein relate to a memory controller for a memory. The memory controller has a dedicated target address buffer for receiving a target address corresponding to a memory operation instruction. As an example, the memory operation instruction might be an instruction to read from the target address. The memory controller also has a dedicated problem address buffer for holding a problem address. For instance, this might be an address in the memory which has an uncorrectable bit error. The memory controller also has a dedicated repair address buffer for holding a repair address to be used to replace the problem address when memory operations instructions are targeted at that problem address. That repair address may be within the memory itself, within a cache of the memory controller, or in any other accessible location.

An address compare combinational circuit compares a received target address held by the dedicated target address buffer with a problem address held by the dedicated repair address buffer. If there is a match, the address compare combinational circuit generates a match notification signal. In response to a match notification signal, an address circuit, which may also be a combinational circuit, responds by causing the repair address within the dedicated repair address buffer to be targeted by the memory operation instruction instead of the problem address being targeted. This principle may be repeated for multiple problem addresses and multiple corresponding replacement addresses.

Thus, the memory controller can use repair address(es) when there are portion(s) of the memory that are no longer usable. This allows for replacement of the memory itself to be delayed until a larger number of problem memory addresses have developed. In environments in which there are a large number of memories in operation, such as in a datacenter, this deferment of memory replacement allows the datacenter to continue operation with less frequent replacement operations.

Furthermore, the repair address replaces the target address using combinational logic, without requiring the use of a microcontroller. A combinational circuit is a circuit in that includes combinational logic, such as logic gates, and flip-flops. Combinational circuits have the characteristic of processing information very fast, but being less flexible than a microcontroller regarding what information is processed. The use of combinational logic allows the address replacement to occur quickly, allowing the response time of the memory to be fast even if a repair address is being used. Thus, the response latency of the memory, which is a critical performance parameter of the memory, may be rapid and consistent. Accordingly, the deferment of the replacement of the memory need not be at the expense of degraded memory performance.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION

At least some embodiments described herein relate to a memory controller for a memory. The memory controller has a dedicated target address buffer for receiving a target address corresponding to a memory operation instruction. As an example, the memory operation instruction might be an instruction to read from the target address. The memory controller also has a dedicated problem address buffer for holding a problem address. For instance, this might be an address in the memory which has an uncorrectable bit error. The memory controller also has a dedicated repair address buffer for holding a repair address to be used to replace the problem address when memory operations instructions are targeted at that problem address. That repair address may be within the memory itself, within a cache of the memory controller, or in any other accessible location.

An address compare combinational circuit compares a received target address held by the dedicated target address buffer with a problem address held by the dedicated repair address buffer. If there is a match, the address compare combinational circuit generates a match notification signal. In response to a match notification signal, an address circuit, which may also be a combinational circuit, responds by causing the repair address within the dedicated repair address buffer to be targeted by the memory operation instruction instead of the problem address being targeted. This principle may be repeated for multiple problem addresses and multiple corresponding replacement addresses.

Thus, the memory controller can use repair address(es) when there are portion(s) of the memory that are no longer usable. This allows for replacement of the memory itself to be delayed until a larger number of problem memory addresses have developed. In environments in which there are a large number of memories in operation, such as in a datacenter, this deferment of memory replacement allows the datacenter to continue operation with less frequent replacement operations.

Furthermore, the repair address replaces the target address using combinational logic, without requiring the use of a microcontroller. A combinational circuit is a circuit in that includes combinational logic, such as logic gates, and flip-flops. Combinational circuits have the characteristic of processing information very fast, but being less flexible than a microcontroller regarding what information is processed. The use of combinational logic allows the address replacement to occur quickly, allowing the response time of the memory to be fast even if a repair address is being used. Thus, the response latency of the memory, which is a critical performance parameter of the memory, may be rapid and consistent. Accordingly, the deferment of the replacement of the memory need not be at the expense of degraded memory performance.

Figure 1:
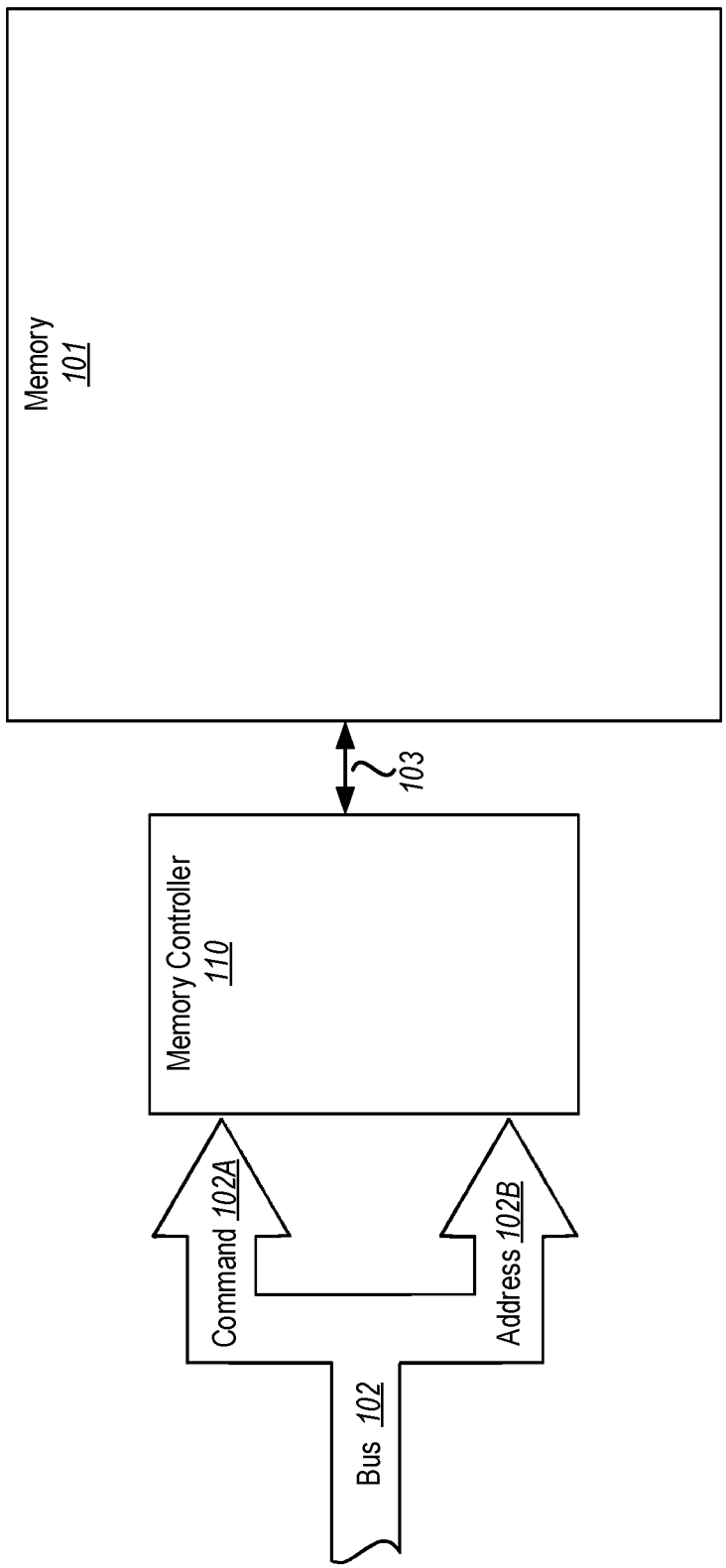
FIG. 1 illustrates a memory system that includes a memory controller that acts as a controller for a memory.

FIG. 1 illustrates a memory system 100 in accordance with the principles described herein. The memory system 100 includes a memory controller 110 that is a controller for the memory 101. The principles described herein are not limited to the type of the memory 101. However, in one embodiment, the memory 101 is a dynamic random access memory.

The memory controller 110 is coupled to a memory bus 102, and receives memory instructions over the memory bus 102. The memory instructions may have been applied to the memory bus 102 by a processor (not shown in FIG. 1). One portion 102A of the memory bus 102 is a command portion, which carries a representation of a command to be performed by the memory controller 110 on the memory 101. Another portion 102B of the memory bus 102B is an address portion, which represents a representation of a target address to which the command is to be executed.

The memory controller 110 typically responds to memory instructions received over the memory bus 102 by executing the command received over the command portion 102A of the memory bus 102 on the target address received from the address portion 102B of the memory bus 102. The memory controller 110 does this by appropriate communication (as represented by the bi-directional arrow 103) with the memory 101.

Figure 2:
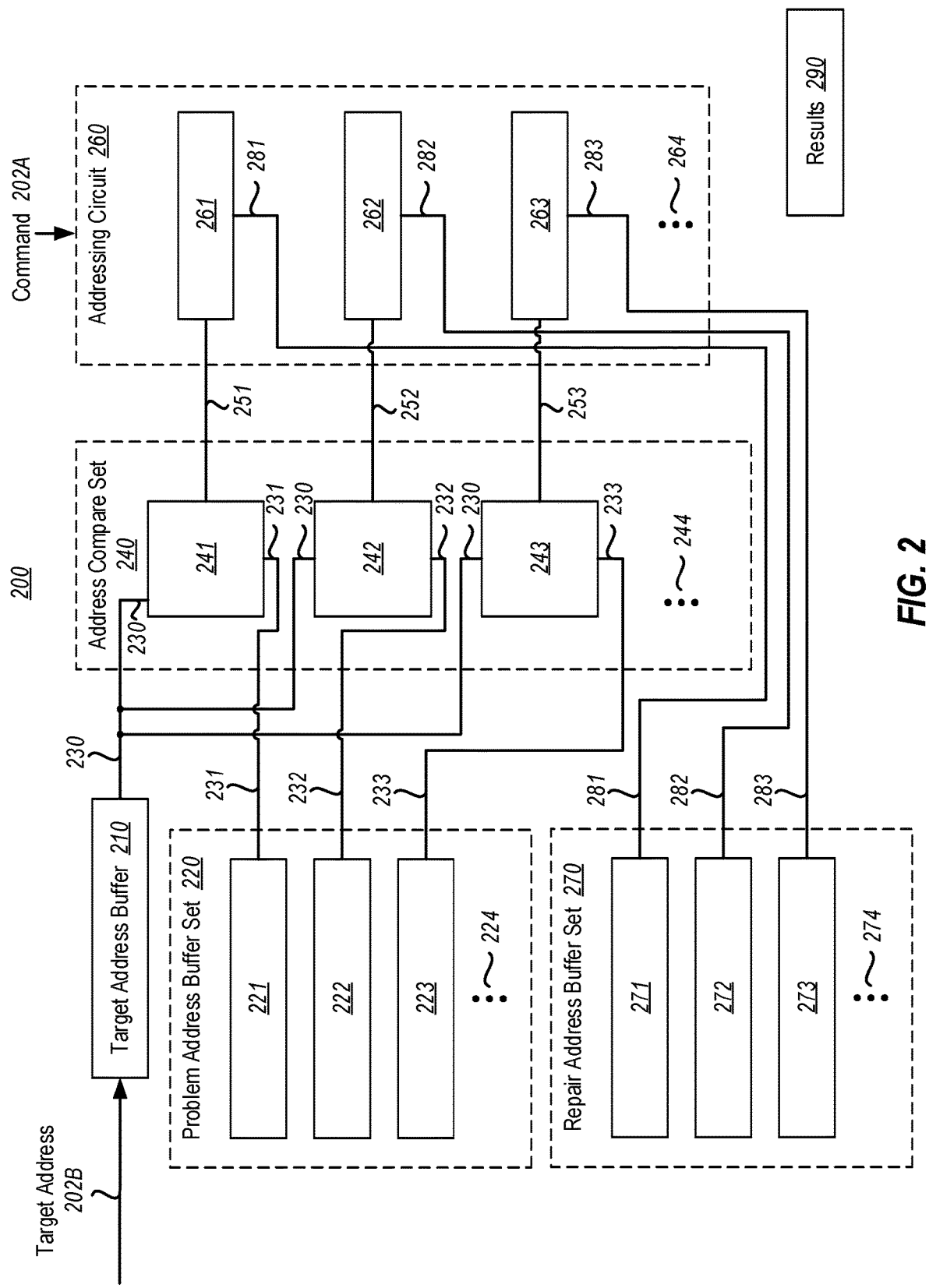
FIG. 2 illustrates an example memory controller that represents one example of the memory controller of FIG. 1, in accordance with the principles described herein.

FIG. 2 illustrates an example memory controller 200 that represents one example of the memory controller 110 of FIG. 1. The memory controller 200 receives the target address 202B of a memory operation instruction at a dedicated target address buffer 210. For instance, the dedicated target address buffer 210 may be coupled to, referring to FIG. 1, the address portion 102B of the memory bus 102, to thereby receive the target address.

The memory controller 202 also includes a dedicated problem address buffer set 220, each dedicated problem address buffer in the set 220 for holding a problem address. In FIG. 2, the dedicated problem address buffer set 220 is illustrated as including three dedicated problem address buffers 221, 222 and 223. Each of the problem address buffers may store a problem address corresponding to an address in memory 101 (see FIG. 1) that no longer operates properly. For instance, one or more of the bits of that address may no longer be capable of storing an information bit.

If there are no problem address within the system memory (e.g., within memory 101), then perhaps the dedicated problem address buffers store some value that does not match to any address in the memory 101. However, once a problem is detected within a particular address of the system memory, then that problem address may be stored in the dedicated problem address buffer 221. After that, if a problem is detected within another particular address of the system memory, then that second problem address may be stored in the second dedicated problem address buffer 222. If after that, yet another problem is detected within yet another particular address of the system memory, then that third problem address may be stored in the third dedicated problem address buffer 223.

The ellipsis 224 represents that the principles described herein are not limited to the number of problem addresses that can be handled by the memory controller. There may be as few as one dedicated problem address buffer within the memory controller 200, to potentially enumerable dedicated problem address buffers within the memory controller 200. The higher the number, the longer that replacement of the memory 101 may be deferred, but the higher the complexity of the replacement operation and the memory controller.

The memory controller 220 also includes a dedicated repair address buffer set 270. For instance, the memory controller 200 uses the repair address within a respective dedicated repair address buffer as the true target address for a memory command when the original target address within the target address buffer 210 is a problem address within a respective dedicated problem address buffer. Thus, each dedicated repair address buffer holds a repair address to be used to replace the respective problem address. Thus, in one embodiment, there are as many dedicated repair address buffers within the dedicated repair address buffer set 270 as there are dedicated problem address buffers within the dedicated problem address buffer set 220.

For instance, the memory controller 200 uses the repair address within the dedicated repair address buffer 271 as the true target address for a memory command when the original target address within the target address buffer 210 is the problem address within the dedicated problem address buffer 221. Likewise, the memory controller 200 uses the repair address within the dedicated repair address buffer 272 as the true target address for a memory command when the original target address within the target address buffer 210 is the problem address within the dedicated problem address buffer 222. The memory controller 200 uses the repair address within the dedicated repair address buffer 273 as the true target address for a memory command when the original target address within the target address buffer 210 is the problem address within the dedicated problem address buffer 223. The ellipsis 274 represents that there may be as many dedicated repair address buffers as there are dedicated problem address buffers. Thus, as many problem addresses as there may be, there may likewise be a repair address for that problem address.

The memory controller 220 further includes an address compare combinational circuit set 240 that collectively determine when a memory command is on a problem address. The address compare combinations circuit set 240 includes an address compare combinational circuit for each of the dedicated problem address buffers in the dedicated problem address buffer set 220. A respective address compare combinational circuit is configured to compare the received target address held by the dedicated target address buffer 111 with a problem address held by a respective dedicated repair address in a respective dedicated repair address buffer, and generate a match notification signal if those two addresses match.

For instance, referring to FIG. 2, the address compare combinational circuit 241 receives (over bus 230) the target address within the dedicated target address buffer 210, and receives (over bus 231) the problem address within the first dedicated problem address buffer 221. If the target address and the first problem address match, the first address compare combinational circuit 241 generates a match notification on match notification output 251. Similarly, the address compare combinational circuit 242 receives (again over bus 230) the target address within the dedicated target address buffer 210, and receives (over bus 232) the second problem address within the second dedicated problem address buffer 222. If the target address and the second problem address match, the second address compare combinational circuit 242 generates a match notification on match notification output 252. Likewise, the address compare combinational circuit 243 receives (again over bus 230) the target address within the dedicated target address buffer 210, and receives (over bus 233) the third problem address within the third dedicated problem address buffer 223. If the target address and the third problem address match, the third address compare combinational circuit 243 generates a match notification on match notification output 253. The ellipsis 244 represents that the address compare combinational circuit set 240 may include any number of address compare combinational circuits for quickly detecting matches of the target address with any number of problem addresses.

The memory controller 220 also includes an addressing circuit 260. There is a normal addressing circuit that is used in the case when the target address is not a problem address. This is normal addressing, and thus the circuitry used to perform such addressing is not illustrated in FIG. 2. The addressing circuit 260 is used to cause the memory command 202A to be performed on the respective repair address, when the target address 202B is, in fact, one of the problem addresses. The addressing circuit 260 may also be a combinational circuit to ensure rapid addressing, even in the case of the target address being a problem address. The addressing circuit 260 may be coupled to the command portion 102A (see FIG. 1) of the memory bus 102 so as to receive the command portion of memory command 202A.

The addressing circuit 260 is configured to respond to a match notification signal generated by any of the address compare combinational circuits within the address compare combination circuit set 240 by causing the repair address within the respective dedicated repair address buffer to be targeted by the memory operation instruction. One way to do this is by having a dedicated problem addressing combinational circuit for each problem address. In that case, there would be three dedicated problem addressing circuits 261, 262 and 263, for each of the possible problem addresses. The ellipsis 264 again represents that there is no limit to the number of dedicated problem addressing circuits.

For instance, if there is a match notification signal on match notification output 251 from the first address compare combinational circuit 241, then the first dedicated problem addressing circuit 261 responds by causing the first repair address (received over bus 281) within the first dedicated repair address buffer 271 to be used as the target of the memory command 202A. Likewise, if there is a match notification signal on match notification output 252 from the second address compare combinational circuit 242, then the second dedicated problem addressing circuit 262 responds by causing the second repair address (received over bus 282) within the second dedicated repair address buffer 272 to be used as the target of the memory command 202A. Also, if there is a match notification signal on match notification output 253 from the third address compare combinational circuit 243, then the third dedicated problem addressing circuit 263 responds by causing the third repair address (received over bus 283) within the third dedicated repair address buffer 273 to be used as the target of the memory command 202A.

Thus, the principles described herein allows target addresses to be replaced by repair addresses when those target addresses are directed towards locations within system memory that have problems. This allows for replacement of the memory to be deferred. Furthermore, there is low latency in responding to memory commands, regardless of whether the target address is a problem address or not. Thus, latency remains low and consistent.

The memory controller also has a results buffer 290. Whether the memory command 202A is performed on the target address (when there are no problems associated with that target address) or a repair address (when the target address has a problem), the memory controller places the result of the memory command 202B within the results buffer 290. The process for processing the memory command 202B when the target address is not a problem address needed not be described herein. However, examples of processing the memory command 202B when the target address is a problem address will now be described with respect to two embodiments. In the first embodiment described with respect to FIG. 3, the repair address is a portion in the memory 101 being controlled by the memory controller 110. Thus, the memory 101 itself is used as a source of redundancy when its own address(es) fail. In the second embodiment described with respect to FIG. 4, a cache location within the system memory may be used as a repair address.

Figure 3:
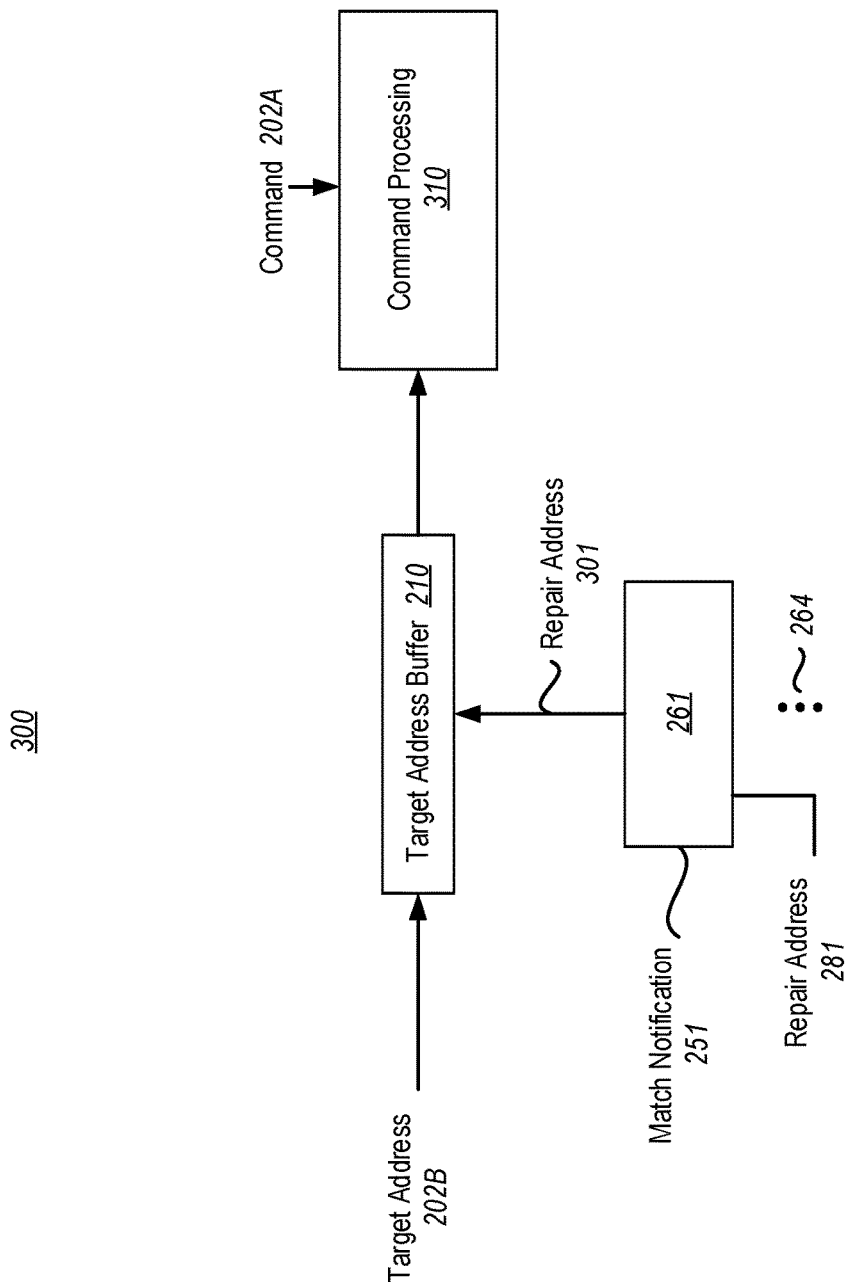
FIG. 3 illustrates an environment that represents a first embodiment of how the microcontroller might perform an operation on a repair address instead of the target address when the target address of the memory command is directed towards a problem address.

FIG. 3 illustrates an environment 300 that represents a first embodiment of how the microcontroller 110 of FIG. 1 might perform an operation on a repair address instead of the target address when the target address of the memory command is directed towards a problem address. The environment 300 includes normal command processing 310 which takes the address (normally the target address of the memory command) within the target address buffer 210 and executes the command 202A using that target address.

However, the environment 300 also shows that when the dedicated problem addressing circuit 261 receives a match notification signal 251, the dedicated problem addressing circuit 361 actually replaces (as represented by arrow 301) the target address within the target address buffer with the received repair address (as represented by arrow 281). As represented by the ellipsis 264, any of the other dedicated problem addressing circuits 262 or 263 may be similarly configured. The normal command processing 310 may then proceed to execute the memory command 202A on the repair address.

Figure 4:
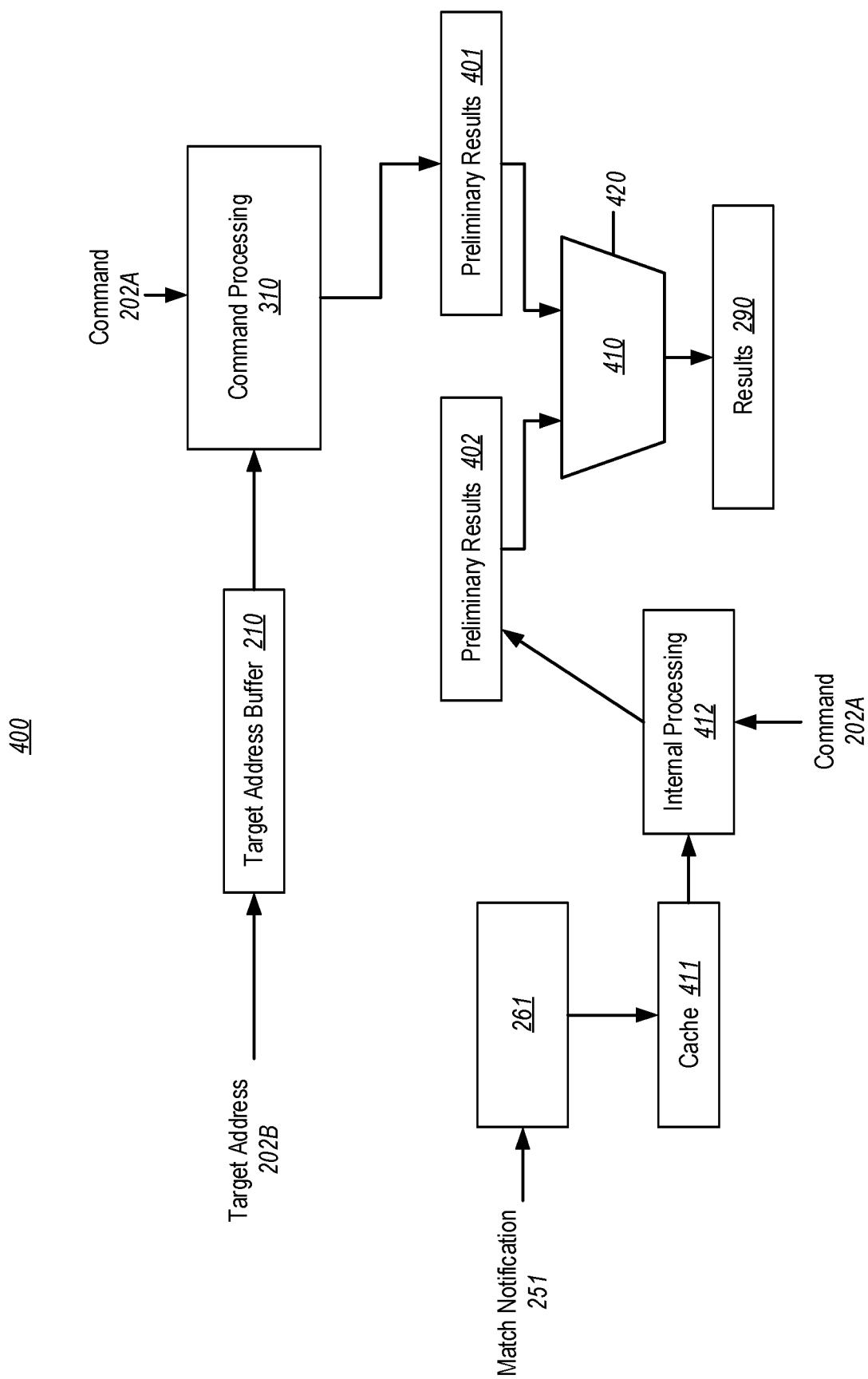
FIG. 4 illustrates an environment that represents a second embodiment of how the microcontroller might perform an operation on a repair address instead of the target address when the target address of the memory command is directed towards a problem address.

FIG. 4 illustrates an environment 400 that represents a second embodiment of how the microcontroller 110 of FIG. 1 might perform an operation on a repair address instead of the target address when the target address of the memory command is directed towards a problem address. The environment 300 includes normal command processing 310 which takes the address within the target address buffer 210 and executes the command 202A using that target address. The result of this normal processing of the memory command on the target address within the memory is placed within a first preliminary results buffer 401.

However, the environment 300 also shows that when the dedicated problem addressing circuit 261 receives a match notification signal 251, the dedicated problem addressing circuit 261 causes the memory command 412 to be internally executed by internal processing 412 on a cache location 411 within the memory controller. The result of this internal processing is placed in a second preliminary results buffer 402. In the case of a read operation, the value from the cache 411 is placed within the second preliminary results buffer 402. A multiplexer 410 receives the values from both the first and second preliminary results buffer.

The multiplexer control signal 420 is generated by the addressing circuit, and represents whether or not the target address matched a problem address. If the multiplexer control signal 420 does not represent such a match, then the results from the first preliminary results buffer 401 is passed to the results buffer 290, thereby representing the result of performing the memory command 202A on the actual target address. If the multiplexer control signal 420 does represent such a match, then the results from the second preliminary results buffer 402 is passed to the results buffer 290, thereby representing the result of performing the memory command 202A on the cache repair address within the memory controller.

Those skilled in the art will also appreciate that the invention may be practiced in a cloud computing environment, which is supported by one or more datacenters or portions thereof. Cloud computing environments may be distributed, although this is not required. When distributed, cloud computing environments may be distributed internationally within an organization and/or have components possessed across multiple organizations.

In this description and the following claims, "cloud computing" is defined as a model for enabling on-demand network access to a shared pool of configurable computing resources (e.g., networks, servers, storage, applications, and services). The definition of "cloud computing" is not limited to any of the other numerous advantages that can be obtained from such a model when properly deployed.

For instance, cloud computing is currently employed in the marketplace so as to offer ubiquitous and convenient on-demand access to the shared pool of configurable computing resources. Furthermore, the shared pool of configurable computing resources can be rapidly provisioned via virtualization and released with low management effort or service provider interaction, and then scaled accordingly. The memory system described herein may be performed in a cloud computing environment to postpone replacement of memories within a datacenter, and enhancing the availability of services provided by the datacenter.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A memory controller that is a controller for a memory, the memory controller comprising:
    a dedicated target address buffer for receiving a target address corresponding to a memory operation instruction;
    a dedicated problem address buffer for holding a problem address;
    a dedicated repair address buffer for holding a repair address to be used to replace the problem address, wherein the repair address is an address of a cache portion within the memory controller;
    an address compare combinational circuit configured to compare the received target address held by the dedicated target address buffer with the problem address held by the dedicated repair address buffer and to generate a match notification signal if the received target address and the problem address match; and
    an addressing circuit configured to respond to a match notification signal generated by the address compare combinational circuit by causing the repair address within the dedicated repair address buffer to be targeted by the memory operation instruction.

2. The memory controller in accordance with claim 1, the addressing circuit also being a combinational circuit.

3. The memory controller in accordance with claim 1, wherein a second repair address is an address within the memory controlled by the memory controller.

4. The memory controller in accordance with claim 3, wherein the addressing circuit is configured to respond to the match notification signal by replacing the target address in the dedicated target address buffer with the repair address from the dedicated repair address buffer.

5. The memory controller in accordance with claim 1, the memory controller further comprising an operation results buffer for holding a result of a performance of the memory operation instruction, the addressing circuit configured to respond to the match notification signal by causing the result of the performance of the memory operation instruction to be placed in the operation results buffer.

6. The memory controller in accordance with claim 5, the memory controller further comprising:
   a first preliminary results buffer for holding the result of the performance of the memory operation instruction on target addresses within the memory;
   a second preliminary results buffer for holding the result of the performance of the memory operation instructions when performed on the cache portion within the memory controller, the addressing circuit configured to respond to the match notification signal by causing the result of the performance of the memory operation instruction to be placed in the second preliminary results buffer; and
   a multiplexer configured to allow content of the second preliminary results buffer to pass to the operation results buffer when the addressing circuit has caused the result of the performance of the memory operation instruction to be placed in the second preliminary results buffer.

7. The memory controller in accordance with claim 5, the result of the performance of the memory operation instruction in the operation results buffer comprising at least a portion of content of the cache portion of the memory controller.

8. The memory controller in accordance with claim 1, the dedicated problem address buffer being a first dedicated problem address buffer, the problem address being a first problem address, the dedicated repair address buffer being a first dedicated repair address buffer, the repair address being a first repair address, the address compare combinational circuit being a first address compare combinational circuit, the memory controller further comprising:
   a second dedicated problem address buffer for holding a second problem address;
   a second dedicated repair address buffer for holding a second repair address to be used to replace the second problem address;
   a second address compare combinational circuit configured to compare the received target address held by the dedicated target address buffer with the second problem address held by the second dedicated repair address buffer and to generate a match notification signal if the received target address and the second problem address match; and
   the addressing circuit further configured to respond to a particular match notification signal generated by the second address compare combinational circuit by using the second repair address within the second dedicated repair address buffer to be targeted by the memory operation instruction.

9. The memory controller in accordance with claim 8, further comprising:
   a third dedicated problem address buffer for holding a third problem address;
   a third dedicated repair address buffer for holding a third repair address to be used to replace the third problem address;
   a third address compare combinational circuit configured to compare the received target address held by the dedicated target address buffer with a third problem address held by the third dedicated repair address buffer and to generate a match notification signal if the received target address and the third problem address match; and
   the addressing circuit configured to further respond to a corresponding match notification signal generated by the third address compare combinational circuit by using the third repair address within the third dedicated repair address buffer to be targeted by the memory operation instruction.

10. The memory controller in accordance with claim 1, the memory controlled by the memory controller comprising dynamic random-access memory.

11. A memory controller that is a controller for a dynamic random-access memory, the memory controller comprising:
    a dedicated target address buffer for receiving a target address corresponding to a memory operation instruction;
    a first dedicated problem address buffer for holding a first problem address;
    a first dedicated repair address buffer for holding a first repair address to be used to replace the first problem address, wherein the first repair address is an address of a cache portion within the memory controller;
    a first address compare combinational circuit configured to compare the received target address held by the dedicated target address buffer with the first problem address held by the first dedicated repair address buffer and to generate a first match notification signal if the received target address and the first problem address match;
    a second dedicated problem address buffer for holding a second problem address;
    a second dedicated repair address buffer for holding a second repair address to be used to replace the second problem address;
    a second address compare combinational circuit configured to compare the received target address held by the dedicated target address buffer with the second problem address held by the second dedicated repair address buffer and to generate a second match notification signal if the received target address and the second problem address match; and
    an addressing combinational circuit configured to respond to the first match notification signal by causing the repair address within the first dedicated repair address buffer to be targeted by the memory operation instruction, and configured to respond to the second match notification signal by using the second repair address within the second dedicated repair address buffer to be targeted by the memory operation instruction.

12. A method for controlling memory, said memory comprising:
    receiving a target address corresponding to a memory operation instruction;
    holding a repair address to be used to replace a problem address, wherein the repair address is an address of a cache portion within a memory controller;
    comparing the received target address with the problem address;
    generating a match notification signal if the received target address and the problem address match; and
    responding to the match notification signal by causing the repair address to be targeted by the memory operation instruction.

13. The method of claim 12, wherein the memory controller receives the target address at a dedicated target address buffer.

14. The method of claim 12, wherein the memory controller includes a dedicated problem address buffer configured to hold the problem address.

15. The method of claim 12, wherein the memory controller includes a number of dedicated repair address buffers and a number of dedicated problem address buffers, and wherein the number of dedicated repair address buffers is the same as the number of dedicated problem address buffers.

16. The method of claim 12, wherein the memory controller includes an address compare combinational circuit set that collectively determines when a memory command is on the problem address.

17. The method of claim 16, wherein the address compare combinational circuit set includes an address compare combinational circuit for a dedicated problem address buffer.

18. The method of claim 17, wherein a particular address compare combinational circuit included in the address compare combinational circuit set is configured to compare the received target address, which is held by a dedicated target address buffer, with the problem address, which is held by a dedicated repair address, and to generate the match notification signal.

19. The method of claim 12, wherein responding to the match notification signal includes replacing the target address with the repair address within a target address buffer.

20. The method of claim 12, wherein the problem address is an address in memory that has an uncorrectable bit error.

* * * * *